United States Patent [19]
Wang et al.

[11] Patent Number: 6,105,154
[45] Date of Patent: Aug. 15, 2000

[54] MULTI-BUS MULTI-DATA TRANSFER PROTOCOLS CONTROLLED BY A BUS ARBITER COUPLED TO A CRC SIGNATURE COMPACTOR

[75] Inventors: Andrew A. Wang; Michael J. Weber, both of Wescosville, Pa.

[73] Assignee: Lucent Technologies, Inc., Murray Hill, N.J.

[21] Appl. No.: 09/087,837

[22] Filed: May 29, 1998

[51] Int. Cl.[7] .......................... G06F 11/277; G06F 13/14; H04B 17/00

[52] U.S. Cl. .......................... 714/732; 710/105; 710/113; 710/240; 710/126; 714/734; 714/733; 714/45; 714/736; 714/738; 714/37; 371/22.4; 371/22.5

[58] Field of Search .............................. 710/1, 128, 105, 710/113, 241, 126; 395/183; 714/30, 34, 726, 732, 733, 734, 735, 736, 737, 738; 340/146.1; 324/73; 712/225; 371/22.5, 22.4

[56] References Cited

U.S. PATENT DOCUMENTS

| | | | |
|---|---|---|---|
| 4,151,510 | 4/1979 | Howell et al. | 340/146.1 |
| 4,320,509 | 3/1982 | Davidson | 714/732 |
| 4,551,837 | 11/1985 | Goegelein et al. | 714/732 |
| 4,750,176 | 6/1988 | Van Veldhuizen | 371/32 |
| 4,862,067 | 8/1989 | Brune et al. | 324/73 |
| 5,488,615 | 1/1996 | Kunoff et al. | 714/732 |
| 5,668,947 | 9/1997 | Batcher | 714/30 |

OTHER PUBLICATIONS

Stephen B. Furber, VLSI RISC Architecture and Organization, Chapter 1, "The Evolution of Computer Architecture," M. Decker (1989) pp. 1–5.

Dhiraj K. Pradhan, "Fault–Tolerant Computing: Theory and Techniques," Prentice–Hall 1986, pp. 142–146.

Konemann et al., "Built–In Test for Complex Digital Integrated Circuits," IEEE Journal of Solid–State Circuits, vol. SC–15, No. 3, Jun. 1980, pp. 315–319.

*Primary Examiner*—Thomas C. Lee
*Assistant Examiner*—Katharina Schuster
*Attorney, Agent, or Firm*—Ratner & Prestia

[57] ABSTRACT

A test system resident in a highly integrated chip having a multi-bus architecture and data transfer protocols among a plurality of modules comprising a plurality of buses, each of the buses having multiple data lines for transferring data based on the data transfer protocols, a multiplexer coupled to the plurality of buses for multiplexing the data onto parallel lines and a CRC signature compactor coupled to the parallel lines for receiving the data. The CRC signature compactor compresses the data and (1) provides a fault-free signature representative of the data in a known fault-free chip, and (2) provides another signature representative of the data in a chip under test, wherein the two signatures are compared to determine whether a fault exists in the chip under test.

13 Claims, 3 Drawing Sheets

MULTI-BUS MULTI-DATA TRANSFER PROTOCOLS CONTROLLED BY A BUS ARBITER COUPLED TO A CRC SIGNATURE COMPACTOR

TECHNICAL FIELD

The present invention relates, in general, to test systems in highly integrated chips and, more specifically, to monitoring and fault detection of data lines in a multi-bus architecture system by utilizing compaction of data techniques.

BACKGROUND OF THE INVENTION

Advanced processor architecture in highly integrated chips normally contain system buses for their complex operations. One example of a highly integrated chip is the Communication Protocol Processor-Cellular (CPP-C) microcontroller chip, Model CPP48010, of Lucent Technologies which uses six segment buses for instruction fetching or data transfers to and from internal and external modules to minimize power consumption. These buses include (1) a text data bus for read operations, which the processor (or core) uses to fetch instructions from internal or external memory devices; (2) an operand bus, utilized by the processor for read and write operations; (3) a static random access memory (SRAM) bus utilized for read and write operations by the core or direct memory access (DMA) controller to on-chip memory modules; (4) a peripheral bus utilized for read and write operations by the core or DMA controller to various on-chip peripherals; (5) a DMA bus utilized for read and write operations by the DMA controller; and (6) an external bus used for read and write operations by the core or DMA controller for various off-chip memory modules or peripherals. All these buses are located on the chip.

In order to isolate bus problems and data transfer faults occurring on the multiple buses due to defects in the chip, the CPP-C microcontroller chip uses 60 primary pins brought out onto the printed wiring board. Through these primary pins internal bus operations can be observed. If a fault is found on any bus, the chip is determined to be faulty.

The added pins require a large area overhead and added bond pads on the printed wiring board. This adds to the manufacturing and assembly costs of the chip on the printed wiring board. As more and more modules may be incorporated or integrated into the chip, additional primary pins may be required. This may become increasingly more difficult, because as more primary pins become necessary, the chip at the same time is becoming smaller and smaller.

In the art of fault detection various test systems have been developed. One such test system requires the generation of input test patterns and the comparison of the input test patterns with the corresponding output patterns. A fault is determined if the output pattern does not match a set of correct responses. This test system has been documented in Built-In Test for Complex Digital Integrated Circuits, by B. Konemann et al., IEEE Journal of Solid State Circuits, Vol. SC15 No. 3 (June 1980), pages 315–318, incorporated herein by reference.

Another known fault detection system is a test system which captures the output response of a unit-under-test and then passes it through a compaction device. The compaction device, or compactor, takes the output response pattern of the unit-under-test and provides an output called the signature of the test response. The signature is then compared to a prior known fault-free response of the unit-under-test and a determination is made whether the unit is faulty.

The choice of compaction technique may be influenced by two factors: (1) the amount of circuitry required to implement the technique, and (2) the loss of effective fault coverage. In general, a fault may go undetected if none of the input test patterns produces an incorrect test output in the presence of the fault.

With output response compaction it may also be possible for a fault to be undetected even though the output response differs from the fault-free response. This may happen whenever the output response from a faulty unit-under-test produces a signature that is identical to the signature of a fault-free unit. This phenomenon is known as aliasing.

A known compaction circuit is a cyclic redundancy checker (CRC) and is documented in Fault Tolerant Computing; Theory and Techniques, pages 142–146, and is incorporated herein by reference. The cyclic redundancy checker uses a Linear Feedback Shift Register (LFSR) technique which shifts the response pattern of the circuit being tested. Depending on how the shift registers are connected, the output response of the LFSR will vary. One possible connection is called a parallel signature analyzer, where the output response of the circuit under test is connected to the LFSR through XOR gates added to the shift lines between stages. There may also be a connection added between the output of the circuit to the first LFSR stage. Other feedbacks between registers may also be added. The manner in which the LFSR is configured may be characterized in terms of a polynomial representation.

Another fault detection system is known as a built-in logic block observer (BILBO). A BILBO, however, has disadvantages. It may require a large overhead; also faults may go undetected because not all bus transactions are visible.

The deficiencies of conventional test systems used to test highly integrated chips having multi-bus architectures show that a need still exists for a test system that can reliably test multi-bus architectures, without adding numerous primary pins to the chip and without creating aliasing problems.

SUMMARY OF THE INVENTION

To meet this and other needs, the present invention provides a test system resident in a highly integrated chip having a multi-bus architecture and data transfer protocols among a plurality of modules comprising a plurality of buses, each of the buses having multiple data lines for transferring data based on the data transfer protocols, a multiplexer coupled to the plurality of buses for multiplexing the data onto parallel lines and a CRC signature compactor coupled to the parallel lines for receiving the data. The CRC signature compactor compresses the data and (1) provides a fault-free signature representative of the data in a known fault-free chip and (2) provides another signature representative of the data in a chip under test, wherein the two signatures are compared to determine whether a fault exists in the chip under test.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. Included in the drawing are the following figures.

DETAILED DESCRIPTION OF THE INVENTION

Figure 1:
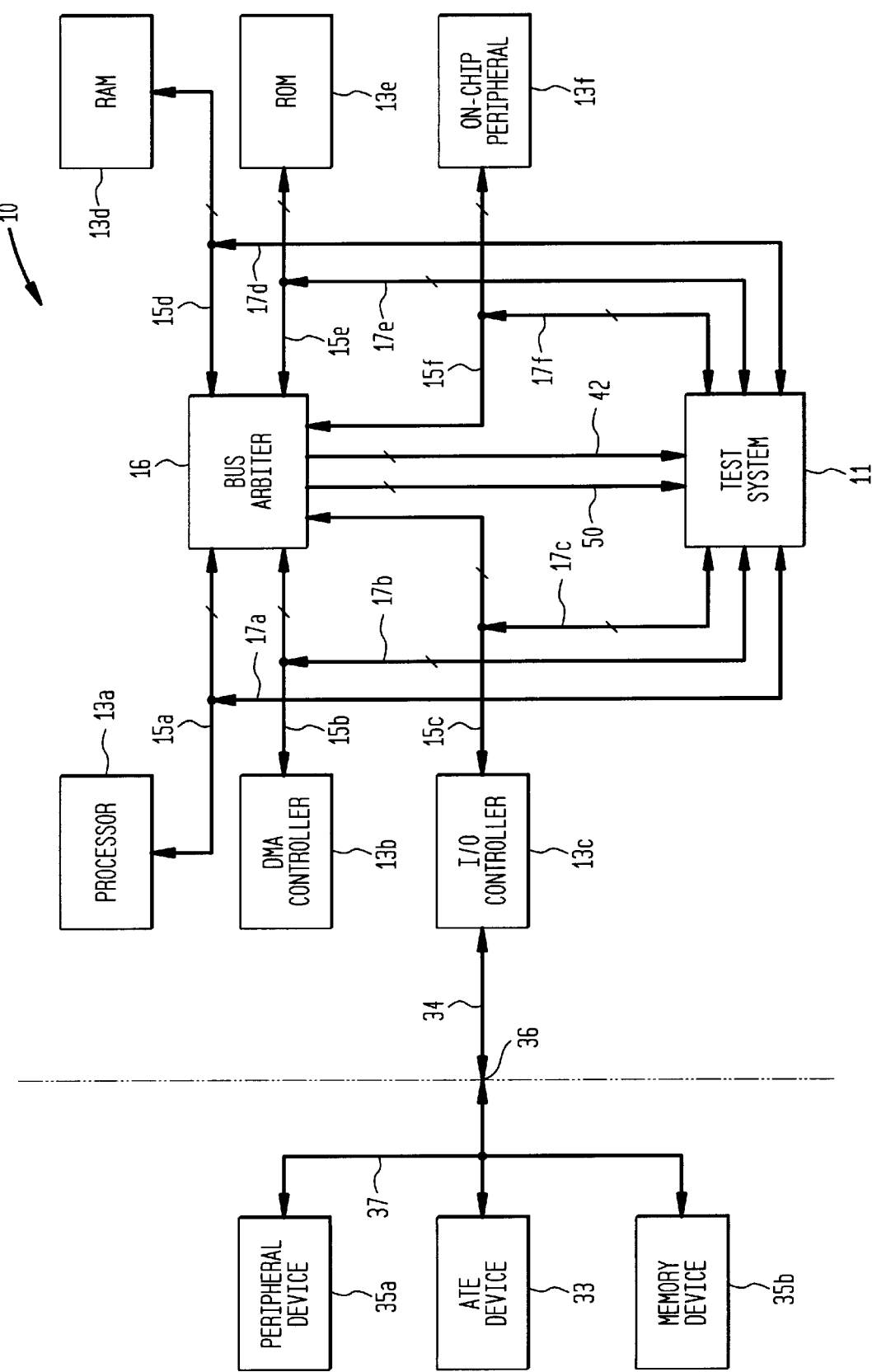
FIG. 1 is a block diagram of a portion of a highly integrated chip showing a multiple bus architecture and a test system.

Referring to FIG. 1, there is shown a multiple bus architecture system in highly integrated chip 10, which may be the CPP-C microcontroller chip as previously described. Modules 13a–13f communicate by way of multi-data buses 15a–15f through a protocol controlled by bus arbiter 16. Test system 11 is resident in chip 10 and is effective in monitoring and compacting data present on multi-data buses 15a–15f by way of test buses 17a–17f. As will be explained, the compaction of data is accomplished with the use of a cyclic redundancy checker (CRC).

All data present on the multi-data buses are captured by test system 11. It will be understood that the data may be placed on the multi-data buses by well known simulation techniques. In operation, such simulation may be generated off the chip by automatic test equipment (ATE) device 33, which may create a test vector. The test vector consists of streams of data which may be provided as an input to chip 10 by way of primary pins 36. The test vector may then be distributed to modules 13a–13f by way of data bus 34, and as required by the protocol controlled by bus arbiter 16.

As the modules respond to the simulation, data appears on multi-data buses 15a–15f. Test system 11 captures the data, compresses the data, and then generates a signature of the data. If chip 10 is under test, the signature generated by test system 11 may be referred to as a test signature. If chip 10 is a known fault-free chip or "golden" chip, the signature generated by test system 11 may be referred to as a fault-free signature. After generating the signature, by command from one of bus masters (described later) test system 11 may place the signature onto bus 17c. I/O controller 13c, with arbitration provided by bus arbiter 16, may take the signature from bus 17c by way of inter-bus 15c, and then may send the signature off the chip to ATE device 33. ATE device 33 may contain the fault-free signature, having previously been stored internally in one of its registers (not shown). When the test signature is received by ATE device 33, it may be compared with the fault-free signature. If the two previously stored signatures do not match, the chip-under-test may be declared to be faulty.

Modules 13a–13f may be any module capable of reading and writing data. In FIG. 1, for example, module 13a may be a processor. It may also be a microprocessor, a digital signal processor, or both. Processor 13a is capable of becoming bus master as part of its data transfer protocol. Module 13b may be a direct memory access (DMA) controller also capable of becoming bus master as part of its data transfer protocol. Module 13c may be an I/O controller; module 13d may be a random access memory (RAM) device; module 13e may be a read only memory (ROM) device; and module 13f may be an on-chip peripheral device. In typical applications, modules 13c, 13d, 13e and 13f may not become bus masters but may only be capable of remaining bus slaves and thus only able to read or write data when commanded by a bus master such as processor 13a or DMA controller 13b.

It will be understood that in some applications a module may be connected to more than one bus. For example, processor 13a may have two buses (not shown). One bus may be an operand bus utilized for read and write operations, and a second bus may be a text data bus utilized to fetch instructions from internal or external memory devices. This architecture, known as a Harvard architecture, is described in VLSI RISC Architecture and Organization by Stephen B. Furber. It will also be understood that modules 13a–13f may be some other arrangement of modules, the exact arrangement not being important. What is important, however, is that bus arbiter 16 may be programmed to handle all data transfers among the modules.

The multi-bus architecture of chip 10 allows interfaces with other modules or peripherals off the chip through I/O controller 13c. Thus, data placed on bus 15c may be sent off the chip via on-chip bus 34 to off-chip bus 37 and to peripheral device 35a, memory device 35b, and ATE device 33. Because bus 37 is off the chip, it may be connected to on-chip bus 34 through primary pins 36.

Buses 15a–15f may each contain various number of data lines on which parallel bits of data may be transferred. For example, bus 15a may consist of 32 lines on which 32 parallel bits of data may be transferred. Bus 15b may consist of 16 lines on which 16 parallel bits of data may be transferred, and so on. Furthermore, each of the buses contains data that may be transferred at a rate specific to the requirements of its module. For example, module 13a may transfer 32-bit data at a rate of 50 Mhz to is module 13d. Thus, bus arbiter 16, who is programmed to respond to the protocol of module 13a, will ensure that data placed on bus 15a is clocked at a 50 Mhz rate onto bus 15d. When the data has been transferred from module 13a to module 13d, bus arbiter 16 devotes its attention to the next data transfer protocol. For example, module 13b may want to read 8-bit data from module 13e at a rate of 25 Mhz. In this case, bus arbiter 16 will respond to that protocol and transfer data from bus 15e to bus 15b at a 25 Mhz rate.

In operation, data flow on buses 15a–15f may be determined by protocols established in the programming of bus arbiter 16. One possible operation includes the following. Bus arbiter 16 may allow module 13a, who is the processor, to become bus master. While module 13a is bus master, it may read instructions from either memory module 13d, by way of bus 15d, or it may read from memory module 13e, by way of bus 15e. Next, DMA module 13b may be allowed to become bus master by the bus arbiter. While the DMA module is bus master, it may read or write to any addressable bus without involving processor module 13a.

In order to fault detect any problem on the inter-buses, as well as faulty responses from the modules attached to the inter-buses, test system 11 may be connected by way of test buses 17a–17f to inter-buses 15a–15f, respectively. As will be explained, test system 11 may compress the data appearing on test buses 17a–17f and provide a signature of that data onto bus 17c. The signature is then sent to ATE module 33 by way of I/O controller 13c.

Figure 2:
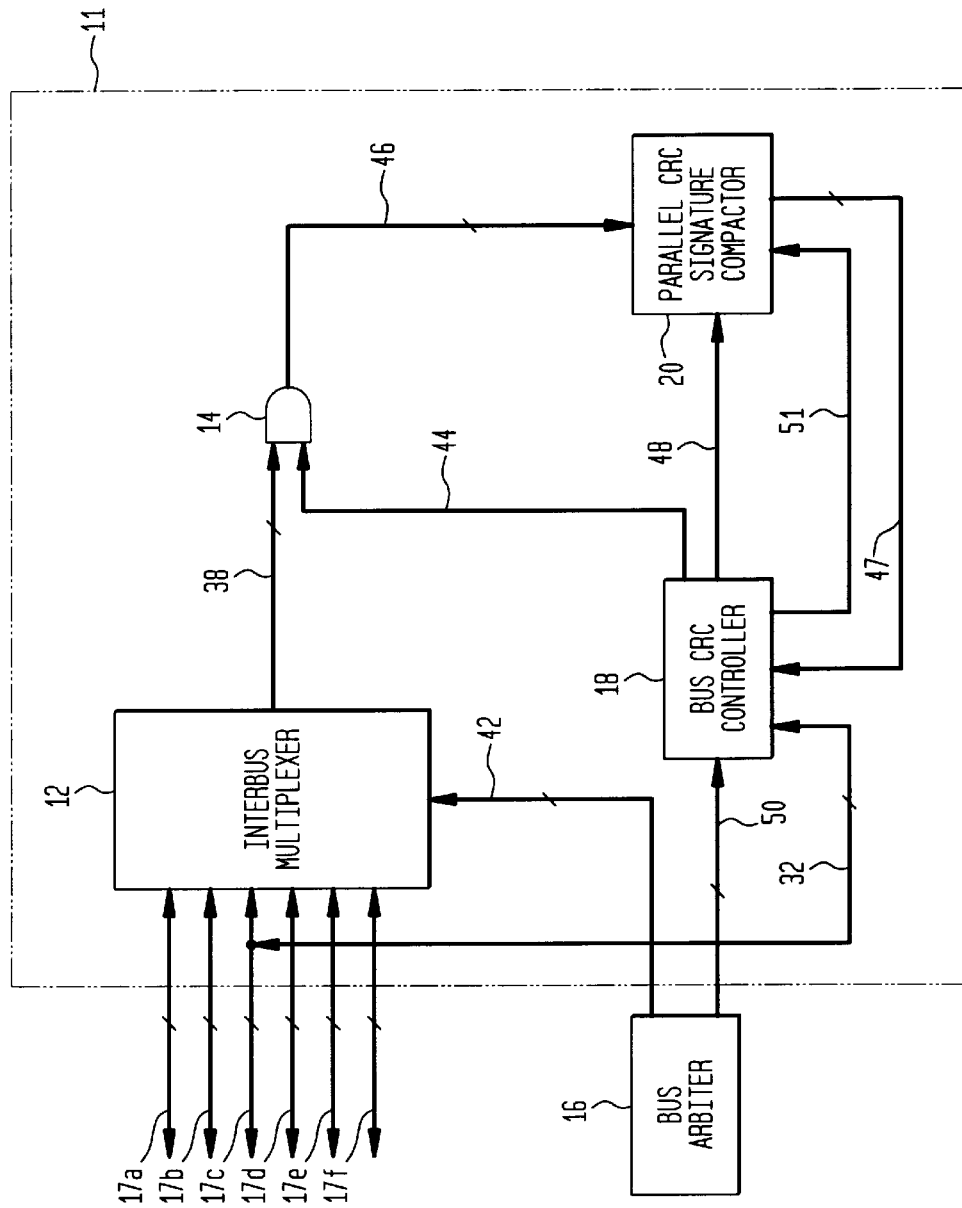
FIG. 2 is a block diagram of the test system.

Test system 11 is shown in more detail in FIG. 2. As shown, inter-bus multiplexer 12 may be connected to every bus in chip 10 by way of test buses 17a–17f. Since bus arbiter 16 is effective in controlling which data buses in the chip may become active and in what particular sequence, data size, and rate data may be transferred, inter-bus multiplexer 12 may be informed of the sequence of bus activity on data buses 15a–15f through control lines 42. Inter-bus multiplexer 12 in response to control lines 42 may transfer data appearing on inter-buses 15a–15f by way of test buses 17a–17f, respectively, onto multiplexed bus 38.

It will be understood that multiplexed bus 38 may contain parallel bits of data which may be 32 bits wide, 16 bits wide or 8 bits wide, etc. Consequently, multiplexed bus 38 must contain a number of data lines which may be as wide as the largest bus in chip 10. In the embodiment of FIG. 2, multiplexed bus 38 contains 32 parallel lines so that 32 bits of parallel data may be multiplexed out by inter-bus multiplexer 12.

In order to start capture of all the data appearing on multiplexed bus 38, bus CRC controller 18, by way of enable line 44, may open gate 14. Bus CRC controller 18 may control the flow of data to parallel signature compactor 20. This may be done with test algorithms during the simulation which may determine when to enable gate 14 and when to send CRC clocking signals 48 to parallel CRC signature compactor 20. Such determination may be made based on information from bus arbiter 16 via information lines 50 and may consist of knowledge of validity of data on any bus, size of data on that bus and transfer rate of data on that bus. It will be understood that the simulation may be programmed by processor 13a through a a memory mapped register (not shown) of bus CRC controller 18 by way of test bus 17c and bus 32. The register may control the start and stop of capturing of the data appearing on bus 46.

As will be explained, parallel CRC signature compactor 20 compresses and provides checksums for all data having been placed on CRC input bus 46. These checksums may be placed on CRC output bus 47. Bus CRC controller 18 then may retain the last checksum in its register (not shown), after processor 13a has terminated capture of the simulation data. The final checksum may then be provided as an output onto bus 32. The final checksum output is known as the signature.

Figure 3:
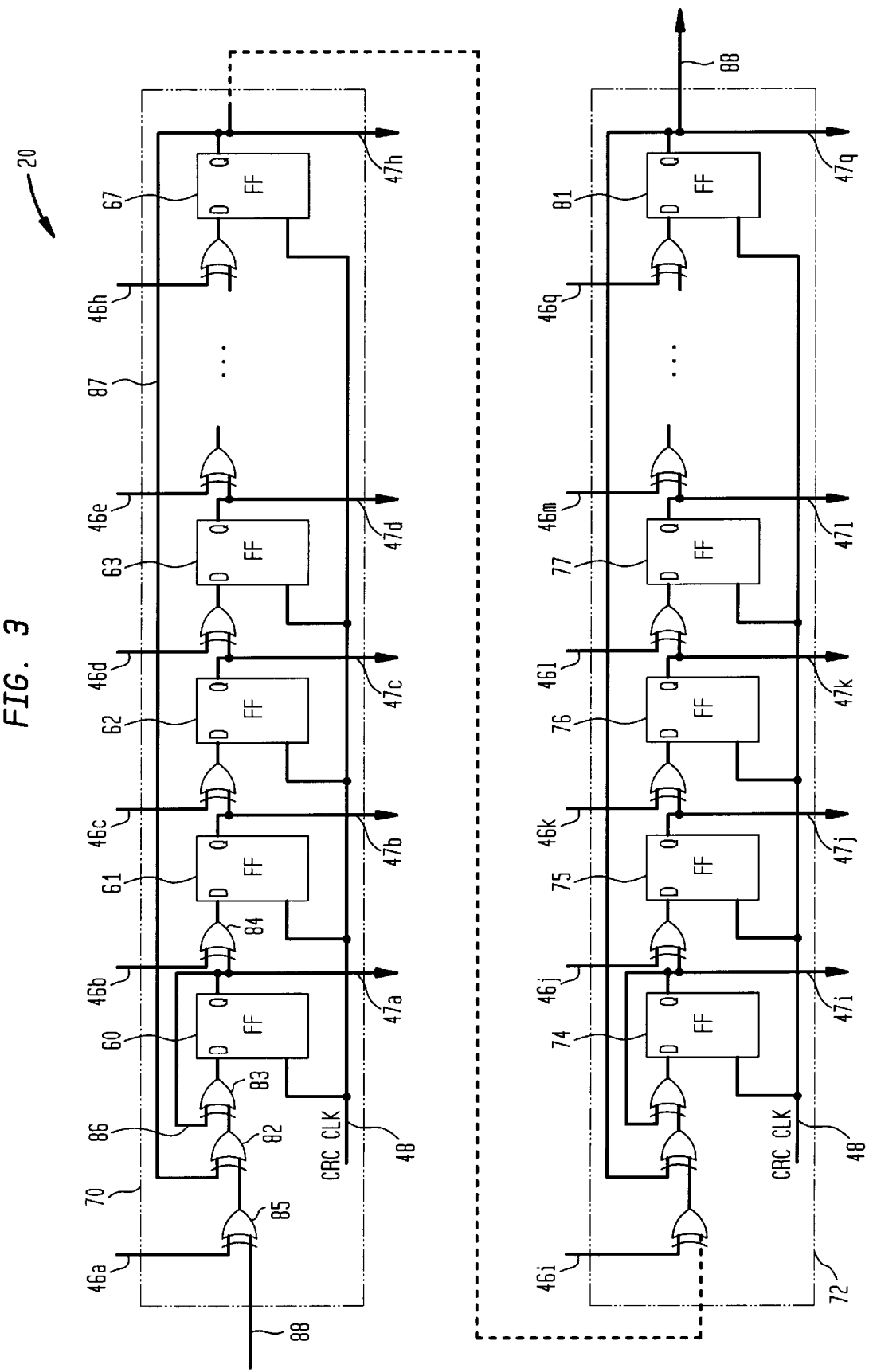
FIG. 3 is a block diagram of a 32-bit cyclic redundancy checker (CRC).

Parallel CRC signature compactor 20 may be based on a 32-bit CRC as shown in FIG. 3. As shown, registers 60–67 may be the first 8 registers in the chain and thus make up a first bank 70. A second and third bank (not shown) may also contain 8 registers each. Lastly, a fourth bank 72 may contain the last 8 registers in the chain, namely registers 74–81. Input data bus 46 shown as data lines 46a–46q in first bank 70, 46i–46q in fourth data bank 72 and the other 16 data lines (not shown) may be represented as a data polynomial D0–D31, each containing the data to be loaded into the shift registers by way of various XOR gates, such as XOR gates 84 and 85. The data may be successively XOR-ed with the contents of the shift registers and shifted from left to right. It will also be noted in FIG. 3 that the output of last register 81 is fedback via line 88 and XOR-ed with the D0 data of input line 46a in XOR gate 85. It will also be noted that the registers in each bank contain two additional feedback lines, such as line 86 which feeds back from first register 60, and line 87 which feeds back from register 67 of bank 70.

As is known, the arrangement of the 32 registers with the above-described feedback lines may be represented as a polynomial with the following expression:

$$g(x)=X0+X7+X8+X15+X16+X23+X24+X31$$

The cycle code that is produced by CRC signature compactor 20 may be represented as a polynomial Q(x) which results from performing multiplication of the feedback coefficients g(x) with D(x):

$$Q(x)=D(x)g(x)$$

where D(x) is a 32 state data polynomial expressed as:

$$D(x)=D0+D1+D2+\ldots+D(m-2)+D(m-1)$$

and
m is the number of shift registers.

It will be understood that CRC compactor 20 may initially contain an arbitrary value in each of its registers. But it may also contain different initial values depending on the startup seed provided by seed line 51 from bus CRC controller 18 (see FIG. 2). The values for the seed may be programmed by processor 13a and sent to bus CRC controller 18 via bus 32.

In operation, simulation data may be placed on the multiple data buses. As the data is captured by compactor 20 and shifted through the 32 shift registers, a checksum, represented by the cycle code polynomial Q(x), may be provided at CRC output bus 47. One checksum may be provided for every 32 bits of data placed on CRC input bus 46. At the end of the simulation period, the last checksum or signature generated by compactor 20 may be exported to external ATE device 33 by way of bus 32. As stated earlier, a signature may be created with a known fault-free chip. Such fault-free signature may be generated from either a fault-free chip or a gold circuit simulation. The next signature may be generated from the chip under test. The two signatures may then be compared by ATE device 33 and a determination may be made whether the chip under test is fault-free.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention. It will be understood, for example, that the present invention is not limited to only the 32 bit CRC. The invention may be extended to a test system having a different number of registers and a different feedback arrangement. Furthermore, the invention may be extended to any multiple bus architecture wherein the CRC signature compactor may monitor the data appearing on the multiple data-buses. Furthermore, the invention may be extended to a different method of generating the test vector. For example, the test vector may be generated by a processor and need not be an external ATE device. Moreover, the invention may be extended to any integrated circuit having a multi-bus architecture.

What is claimed:

1. A test system resident in an integrated chip having multi-bus architecture and multi-data transfer protocols controlled by a bus arbiter comprising:

a plurality of buses, each of said buses transferring data based on one of said multi-data transfer protocols, a multiplexer coupled to said plurality of buses for multiplexing said data onto parallel lines, a cyclic redundancy checker (CRC) signature compactor coupled to said bus arbiter and receiving information on said data from the bus arbiter, the CRC signature compactor coupled to said parallel lines for receiving said data, said CRC signature compactor compressing said data in response to said received information and (1) providing a fault-free signature representative of said data in a known fault-free chip, and (2) providing another signature representative of said data in a chip under test, wherein said other signature is compared to said fault-free signature to determine whether a fault exists in said chip under test.

2. The test system of claim 1 wherein said CRC signature compactor includes multiple shift registers and XOR gates characterized by a polynomial $g(x)=XO+X7+X8+X15+X16+X23+X24+X31$.

3. The test system of claim 2 further including a bus CRC controller coupled to said CRC signature compactor for controlling said data on said parallel lines, wherein said bus CRC controller selects a sequence of said data and clocks said sequence into said CRC signature compactor.

4. The test system of claim 3 further including output lines containing checksums, wherein said sequence of data is characterized by an m-state data polynomial $D(x)=D(0)+D(1)+D(2)+ - - - +D(m-2)+D(m-1)$, m representing the number of shift registers in said CRC signature compactor and said checksums are characterized by a polynomial resulting from multiplication of $g(x)$ with $D(x)$.

5. A method for testing multiple data buses in an integrated chip having a plurality of buses and multi-data transfer protocols among a plurality of modules, each of said buses transferring data based on one of said multi-data transfer protocols controlled by a bus arbiter, comprising the steps of:

(a) multiplexing the data from the plurality of buses onto parallel lines, (b) transmitting information on the data from the bus arbiter to a CRC signature compactor, (c) compressing the data by the CRC signature compactor in response to the received information and providing a fault-free signature representative of the data, (d) compressing the data by said CRC signature compactor in response to the received information and providing another signature representative of the data in a chip under test, and (e) comparing the fault-free signature with the other signature to determine whether a fault exists.

6. The method of claim 5 in which step (a) includes enabling the multiplexing of the data based on the received information.

7. The method of claim 6 in which step (c) includes clocking the data from the parallel lines into the CRC signature compactor.

8. The method of claim 7 in which steps (d) and (e) include transmitting the other signature to one of the plurality of buses, sending the other signature off the plurality of buses and off the chip and comparing off the chip the other signature with the fault-free signature.

9. In an integrated circuit having multi-bus architecture and multi-data transfer protocols controlled by a bus arbiter, a system for testing the integrated circuit comprising:

a plurality of buses, each of said buses transferring data based on one of said multi-data transfer protocols, a multiplexer coupled to said plurality of buses for multiplexing said data onto parallel lines, a cyclic redundancy checker (CRC) signature compactor coupled to said bus arbiter and receiving information on said data from the bus arbiter, the CRC signature compactor coupled to said parallel lines for receiving said data, said CRC signature compactor compressing said data in response to said received information and (1) providing a fault-free signature representative of said data in a known fault-free integrated circuit, and (2) providing another signature representative of said data in an integrated circuit under test, wherein said other signature is compared to said fault-free signature to determine whether a fault exists in said integrated circuit under test.

10. The system of claim 9 further including
a CRC controller coupled to said bus arbiter and receiving said information, the CRC controller enabling the CRC signature compactor to receive the data in response to said information.

11. The system of claim 10 wherein the information includes at least one of size of the data, transfer rate of the data and the activation of the transfer of the data on the one bus.

12. A test system resident in an integrated chip having multi-bus architecture and data transfer protocols among a plurality of modules comprising:

a plurality of buses, each of said buses transferring data based on said data transfer protocols;

a multiplexer coupled to said plurality of buses for multiplexing said data onto parallel lines;

a CRC signature compactor coupled to said parallel lines for receiving said data, said CRC signature compactor compressing said data and (1) providing a fault-free signature representative of said data in a known fault-free chip, and (2) providing another signature representative of said data in a chip under test, wherein said other signature is compared to said fault-free signature to determine whether a fault exists in said chip under test;

said CRC signature compactor including multiple shift registers and XOR gates characterized by a polynomial $g(x)=X0+X7+X8+X15+X16 +X23+X24+X31$;

a bus CRC controller coupled to said CRC signature compactor for controlling said data on said parallel lines, wherein said bus CRC controller selects a sequence of said data and clocks said sequence into said CRC signature compactor; and output lines from said CRC signature compactor containing checksums, wherein said sequence of data is characterized by an m-state data polynomial $D(x)=D(0)+D(1)+D(2)+ - - - +D(m-2)+D(m-1)$, m representing the number of shift registers in said CRC signature compactor and said checksums are characterized by a polynomial resulting from multiplication of $g(x)$ with $D(x)$.

13. The test system of claim 12 further including means for providing said fault-free signature and said other signature from said checksums.

* * * * *